United States Patent
Chang et al.

(10) Patent No.: US 10,794,958 B2
(45) Date of Patent: Oct. 6, 2020

(54) SYSTEM AND METHOD OF DETERMINING BATTERY SYSTEM CONDITION

(71) Applicant: Dell Products L.P., Round Rock, TX (US)

(72) Inventors: Chia-Fa Chang, Linkou Township (TW); Chia Liang Lin, Taoyuan (TW); Jui Chin Fang, New Taipei (TW); Shao Szu Ho, New Taipei (TW); No Hua Chuang, Taipei (TW)

(73) Assignee: Dell Products L.P., Round Rock, TX (US)

( * ) Notice: Subject to any disclaimer, the term of this patent is extended or adjusted under 35 U.S.C. 154(b) by 698 days.

(21) Appl. No.: 15/641,046

(22) Filed: Jul. 3, 2017

(65) Prior Publication Data
US 2019/0004119 A1    Jan. 3, 2019

(51) Int. Cl.
  *G01R 31/36* (2020.01)
  *G01R 31/367* (2019.01)
  *G01R 31/387* (2019.01)
  *H01M 10/42* (2006.01)
  *H01M 10/48* (2006.01)

(52) U.S. Cl.
  CPC ......... *G01R 31/367* (2019.01); *G01R 31/387* (2019.01); *H01M 10/425* (2013.01); *H01M 10/48* (2013.01); *H01M 2010/4271* (2013.01); *H01M 2010/4278* (2013.01)

(58) Field of Classification Search
  USPC .......................................................... 702/63
  See application file for complete search history.

(56) References Cited

U.S. PATENT DOCUMENTS

| | | |
|---|---|---|
| 6,789,026 B2 | 9/2004 | Barsoukov et al. |
| 6,832,171 B2 | 12/2004 | Barsoukov et al. |
| 6,892,148 B2 | 5/2005 | Barsoukov et al. |
| 2006/0125482 A1* | 6/2006 | Klang ............... G01R 31/389 324/426 |

(Continued)

OTHER PUBLICATIONS

Yevgen Barsukov. "Theory and Implementation of Impedance Track Battery Fuel-Gauging Algorithm in bq20z8x Product Family." Texas Instruments Application Report-SLUA364 (Nov. 2005); 8 pages.

(Continued)

*Primary Examiner* — Paul D Lee
(74) *Attorney, Agent, or Firm* — Baker Botts L.L.P.

(57) ABSTRACT

In one or more embodiments, an information handling system may include an embedded controller, communicatively coupled to a battery system that is configured to power the information handling system. The embedded controller may be configured to: receive a cycle count from the battery system; determine that the cycle count is above a threshold; query the battery system for an expected margin of error, in response to determining that the cycle count is above the threshold; receive the expected margin of error from the battery system; determine that the expected margin of error is within a range; and in response to determining that the expected margin of error is within the range, compute a condition metric of the battery system based on a prediction of a capacity of the battery system and a design capacity of the battery system and store the condition metric of the battery system.

18 Claims, 6 Drawing Sheets

(56) References Cited

U.S. PATENT DOCUMENTS

| | | | | |
|---|---|---|---|---|
| 2011/0161025 A1* | 6/2011 | Tomura | ................... | G06F 19/00 |
| | | | | 702/63 |
| 2013/0278223 A1* | 10/2013 | Li | ..................... | H01M 10/48 |
| | | | | 320/136 |
| 2015/0212158 A1* | 7/2015 | Takahashi | ............. | H01M 10/48 |
| | | | | 324/424 |
| 2018/0210037 A1* | 7/2018 | Ataka | .................... | G01R 27/26 |
| 2018/0373308 A1* | 12/2018 | Sultenfuss | .............. | G06F 1/206 |

OTHER PUBLICATIONS

Texas Instruments, "bq20z80-V110 + bq29312A Chipset," Technical Reference Manual: SLUU276, Jun. 2007; 212 pages.

ATMEL, "AVR453: Smart Battery Reference Design." 8-bit AVR Microcontrollers, Application Notice, 2006; 37 pages.

Texas Instruments, "SBS 1.1—Compliant Gas Gauge Enabled with Impedance Track Technology for Use With the bq29312A." Texas Instructions, SLUS681B—Jan. 2007; 30 pages.

Miller, Charlie. "Battery firmware hacking." Inside the innards of a Smart Battery, Jul. 12, 2011; 38 pages.

Texas Instruments, "bq40z50-R1 Technical Reference." Texas Instruments: SLUUBC1C, Nov. 2016; 244 pages.

Texas Instruments, "bq2423x USB-Friendly Lithium-Ion Battery Charger and Power-Path Management IC." Texas Instruments: SLUS821J, May 2017; 46 pages.

Joshi, Abhishek A., "Wide-Vin Battery Charger Using SMBus Communication Interface Between MSP430 MCUs and bq Fuel Gauges." Texas Instruments Application Report-SLAA476A, Jul. 2011; 43 pages.

Texas Instruments, "bq4050 Technical Reference." Texas Instruments: SLUUAQ3, Mar. 2016; 203 pages.

Texas Instruments, "bq24725A 1-4 Cell Li+ Battery SMBus Charge Controller with N-Channel Power MOSFET Selector and Advanced Circuit Protection." Texas Instruments: SLUSAL0A, Aug. 2014; 47 pages.

SBS-Forum, "Smart Battery Data Specification." SBS Implementers Forum, Revision 1.1, Dec. 11, 1998; 54 pages.

Distributed Management Task Force, Inc., "Common Information Model (CIM) Infrastructure." (DMTF) DSP0004; Apr. 22, 2012; 186 pages.

\* cited by examiner

SYSTEM AND METHOD OF DETERMINING BATTERY SYSTEM CONDITION

BACKGROUND

Field of the Disclosure

This disclosure relates generally to information handling systems and more particularly to utilizing batteries in computing devices.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems. In the past, health conditions and/or states of batteries utilized in computing devices were not always determined with reliable or credible data, and batteries with in good condition or health were deemed problematic or malfunctioning by users.

SUMMARY

In one or more embodiments, an information handling system may include an embedded controller, communicatively coupled to a battery system that is configured to power the information handling system, configured to receive a cycle count from the battery system and determine that the cycle count is above a threshold. The embedded controller may further query the battery system for an expected margin of error in response to determining that the cycle count is above the threshold, receive the expected margin of error from the battery system, and determine that the expected margin of error is within a range. In response to determining that the expected margin of error is within the range, the embedded controller may compute a condition metric of the battery system based on a prediction of a capacity of the battery system and a design capacity of the battery system and may store the condition metric of the battery system. In one or more embodiments, when the embedded controller determines that the expected margin of error is within the range, the embedded controller may further determine that the expected margin of error is below another threshold. In one or more embodiments, the embedded controller may be further configured to query the battery system for the prediction of the capacity of the battery system, in response to determining that the expected margin of error is within the range.

In one or more embodiments, the information handling system may include a processor and a memory medium, communicatively coupled to the processor, which may store instructions that are executable by the processor. In one example, the instructions may be executable by the processor to query the embedded controller for the condition metric of the battery system. The memory medium may further store instructions further executable by the processor to utilize a management information exchange that may permit communications between an operating system and the embedded controller, when the processor executes the instructions to query the embedded controller for the condition metric of the battery system. For instance, the management information exchange includes at least one of a Windows Management Interface (WMI) and a Common Information Model (CIM), among others. In another example, the instructions may be executable by the processor to receive, via a graphical user interface, a request for the condition metric of the battery system and provide, via the graphical user interface, information indicating the condition metric of the battery system. In one or more embodiments, the information handling system may be a portable information handling system configured to be carried by a user. For example, the information handling system may include the battery system.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a reference numeral followed by a letter refers to a specific instance of an element and the numeral only form of the reference numeral refers to the collective element. Thus, for example, device '12A' refers to an instance of a device class, which may be referred to collectively as devices '12' and any one of which may be referred to generically as a device '12'.

In one or more embodiments, one or more systems, method, and/or processes may be utilized in determining a condition metric of a battery system. For example, the condition metric of the battery system may indicate a health condition and/or a health state of the battery system. In one or more embodiments, the battery system may provide one or more attributes that may be utilized in credibly determining the condition metric of the battery system. For example, with a credible determination of the condition metric of the battery system, determining a replacement of the battery system may be efficient, economical, and/or practical. For instance, the credible determination of the condition metric of the battery system may be based on determining if margin of error of an attribute is within a range and/or is below a threshold. In one or more embodiments, a state of condition of a battery system may be determined by an ability of the battery system to accept and retain charge and provide power to an information handling system. For example, one or more factors may diminish the battery system. For instance, one or more of aging, operating temperatures, storage temperatures, and discharge/charge cycles, among others, may diminish the battery system.

In one or more embodiments, a power capacity of the battery system may diminish with usage of the battery system. For example, the battery system may provide a prediction of a power capacity of the battery system. For instance, the battery system may provide a prediction of charge capacity, such as a full charge capacity (FCC), which may indicate the prediction of a power capacity of the battery system. In one or more embodiments, the prediction of a power capacity of the battery system may be associated with an expected margin of error. For example, accuracy of a condition metric of the battery system may be associated with the expected margin of error. For instance, the condition metric of the battery system may be based on the FCC, and the expected margin of error may be utilized in determining if the FCC may be suitably utilized as an indicator of the condition metric of the battery system. In one or more embodiments, if a number of charge/discharge cycles is below a threshold, one or more of the expected margin of error and the FCC of the battery system, among others, may not be reliable and/or credible. For example, if the number of charge/discharge cycles is below the threshold, the expected margin of error may not be a suitable indicator for a reliability, credibility, and/or suitability of the FCC in determining the condition metric of the battery system. For instance, if one or more indicators that may be utilized in determining the condition metric of the battery system may not be reliable, credible, and/or suitable, a reliable, credible, and/or suitable determination of a health condition and/or a health state of the batter system may not be possible until the one or more indicators are reliable, credible, and/or suitable.

Figure 1:
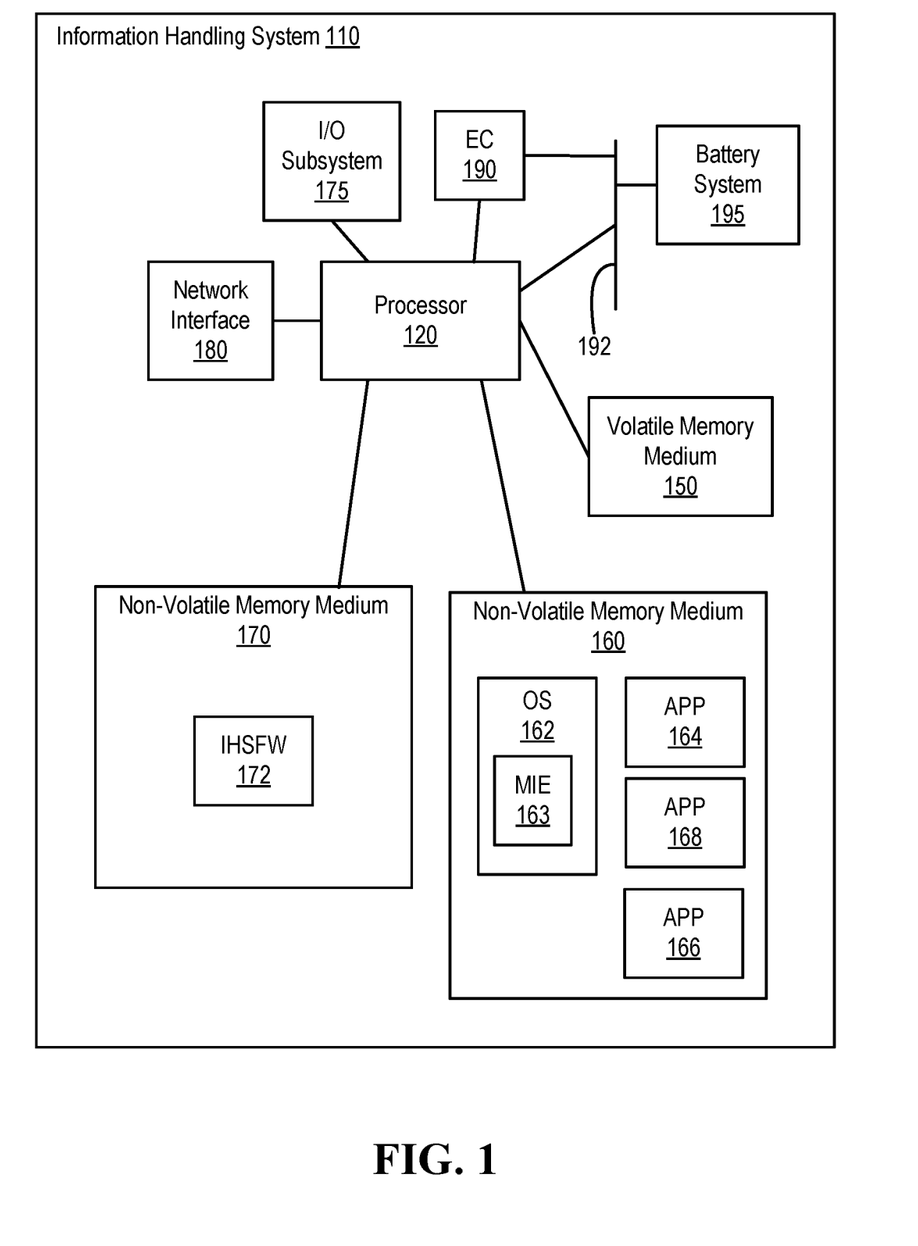
FIG. 1 illustrates an information handling system, according to one or more embodiments.

Turning now to FIG. 1, an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a personal digital assistant (PDA), a portable information handling system configured to be carried by a user (e.g., a person), a consumer electronic device, an electronic music player, an electronic camera, an electronic video player, a network storage device, or another suitable device and may vary in size, shape, performance, functionality, and price. In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, a HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, a volatile memory medium 150, non-volatile memory media 160 and 170, an I/O subsystem 175, and a network interface 180. As illustrated, volatile memory medium 150, non-volatile memory media 160 and 170, I/O subsystem 175, and network interface 180 may be communicatively coupled to processor 120.

In one or more embodiments, one or more of volatile memory medium 150, non-volatile memory media 160 and 170, I/O subsystem 175, and network interface 180 may be communicatively coupled to processor 120 via one or more buses, one or more switches, and/or one or more root complexes, among others. In one example, one or more of volatile memory medium 150, non-volatile memory media 160 and 170, I/O subsystem 175, and network interface 180 may be communicatively coupled to processor 120 via one or more PCI-Express (PCIe) root complexes. In another example, one or more of an I/O subsystem 175 and a network interface 180 may be communicatively coupled to processor 120 via one or more PCIe switches.

In one or more embodiments, term "memory medium" may mean a "storage device", a "memory", a "memory device", "tangible computer readable storage medium", and/or "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network.

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing one or more systems, flowcharts, methods, and/or processes described herein. In one example, processor 120 may execute processor instructions from one or more of memory media 150-170 in implementing one or more systems, flowcharts, methods, and/or processes described herein. In another example, processor 120 may execute processor instructions via network interface 180 in implementing one or more systems, flowcharts, methods, and/or processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150-170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or functionalities of one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

As shown, OS 162 may include a management information exchange (MIE) 163. In one example, MIE 163 may permit multiple components to exchange management information associated with managed elements (e.g., elements of IHS 110) and/or may permit control and/or management of the managed elements. In a second example, MIE 163 may provide communications between at least one of OS 162 and APPs 162-166 and IHSFW 172. For instance, IHSFW 172 may communicate with one or more elements of IHS 110 (e.g., processor 120, PCH 130, volatile memory medium 150, non-volatile memory media 160 and 170, network interfaces 180A and 180B, EC 190, etc.). In another example, MIE 163 may include a driver and/or a driver model that may provide an OS interface through which managed elements may provide information and/or notifications, among others. In one instance, MIE 163 may be or include a Windows Management Interface (WMI) for ACPI (available from Microsoft Corporation). In another instance, MIE 163 may be or include a Common Information Model (CIM) (available via the Distributed Management Task Force). In one or more embodiments, MIE 163 may permit communications between EC 190 and OS 162. For example, EC 190 may utilize MIE 163 in providing information to OS 162. In one instance, EC 190 may utilize at least one of WMI and CIM, among others, in providing the information to OS 162. In another instance, the information provided to OS 162 may include battery system condition and/or battery system health information, among others.

In one or more embodiments, EC 190 may be or include a microcontroller. For example, the microcontroller may be or include an 8051 microcontroller, an ARM Cortex-M (e.g., Cortex-M0, Cortex-M0+, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, EC 190 may be or include one or more of a field programmable gate array (FPGA) and an application specific integrated circuit (ASIC), among others, configured, coded, and/or encoded with instructions in accordance with one or more of systems, flowcharts, methods, and/or processes described herein.

In one or more embodiments, processor 120 and one or more components of IHS 110 may be included in a system-on-chip (SoC). For example, the SoC may include processor 120 and a platform controller hub (not specifically illustrated).

As illustrated, IHS 110 may include a bus 192, and one or more of processor 120 and EC 190 may be coupled to bus 192. In one or more embodiments, bus 192 may be or include a MCA bus, an ISA bus, an EISA bus, a PCI bus, a HT bus, an I$^2$C bus, a SPI bus, a LPC bus, an eSPI bus, a USB, a SMBus, and a two-wire bus, among others. As shown, a battery system 195 may be coupled to bus 192. In one example, IHS 110 may include battery system 195. In a second example, battery system 195 may be external to IHS 110 (although not specifically illustrated in FIG. 1). In another example, battery system 195 may be plugged into IHS 110. In one or more embodiments, battery system 195 may provide power to IHS 110 and/or one or more elements of IHS 110, among others.

Figure 2:
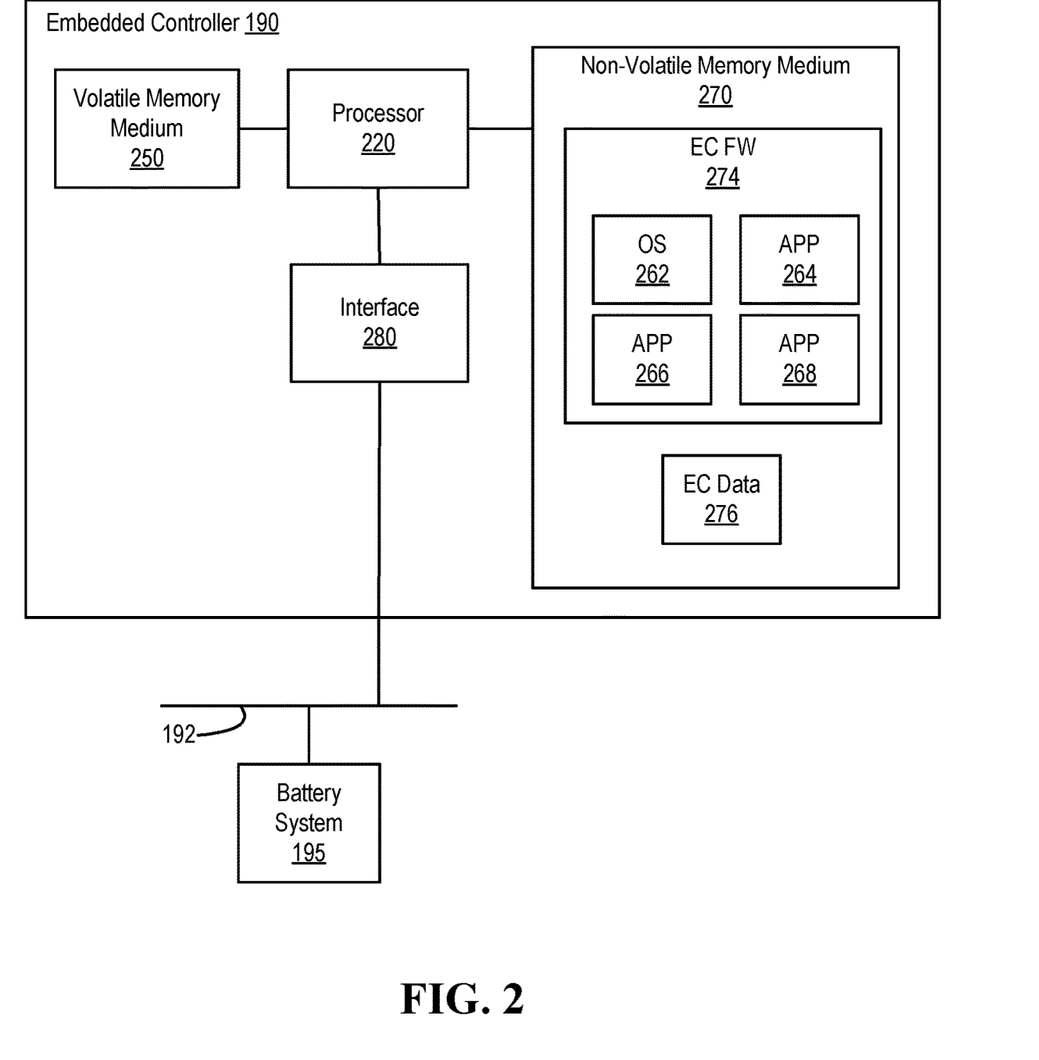
FIG. 2 illustrates an embedded controller, according to one or more embodiments.

Turning now to FIG. 2, an embedded controller is illustrated, according to one or more embodiments. As shown, EC 190 may include a processor 220, a volatile memory medium 250, a non-volatile memory medium 270, and an interface 280. As illustrated, non-volatile memory medium 274 may include an EC FW 274, which may include an OS 262 and APPs 264-268, and may include EC data 276. For example, OS 262 may be or include a real-time operating system (RTOS).

In one or more embodiments, interface 280 may include circuitry that enables communicatively coupling to one or more devices. In one example, interface 280 may include circuitry that enables communicatively coupling to one or more buses. For instance, interface 280 may include circuitry that enables communicatively coupling to bus 192 and/or that enables communicating with battery system 195 via bus 192. In another example, interface 280 may include circuitry that enables one or more interrupt signals to be received. For instance, interface 280 may include general purpose input/output (GPIO) circuitry, and the GPIO circuitry may enable one or more interrupt signals to be received via at least one interrupt line.

In one or more embodiments, one or more of OS 262 and APPs 264-268 may include processor instructions executable by processor 220. In one example, processor 220 may execute processor instructions of one or more of OS 262 and APPs 264-268 via non-volatile memory medium 270. In another example, one or more portions of the processor instructions of the one or more of OS 262 and APPs 264-268 may be transferred to volatile memory medium 250, and processor 220 may execute the one or more portions of the processor instructions of the one or more of OS 262 and APPs 264-268 via volatile memory medium 250. In one or more embodiments, processor 220 may execute processor instructions in implementing one or more systems, flowcharts, methods, and/or processes described herein. For example, processor 220 may execute processor instructions from one or more of memory media 250 and 270 in implementing one or more systems, flowcharts, methods, and/or processes described herein.

In one or more embodiments, processor 220 may utilize EC data 276. In one example, processor 220 may utilize EC data 276 via non-volatile memory medium 270. In a second example, one or more portions of EC data 276 may be transferred to volatile memory medium 250, and processor 220 may utilize EC data 276 via volatile memory medium 250. In a third example, processor 220 may store one or more statuses via EC data 276. For instance, processor 220 may store one or more predictions of a power capacity of a battery system, one or more expected margins of error, and/or one or more condition metrics of a battery system, among others. In another example, processor 220 may provide the one or more statuses to OS 162 that were stored via EC data 276. For instance, processor 220 may provide, to OS 162, information associated with the one or more predictions of a power capacity of a battery system, one or more expected margins of error, and/or one or more condition metrics of a battery system, among others. In one or more embodiments, OS 162 may query EC 190 for information associated with a battery system. For example, OS 162 may utilize MIE 163 to query EC 190 for the information associated with battery system 195.

Figure 3:
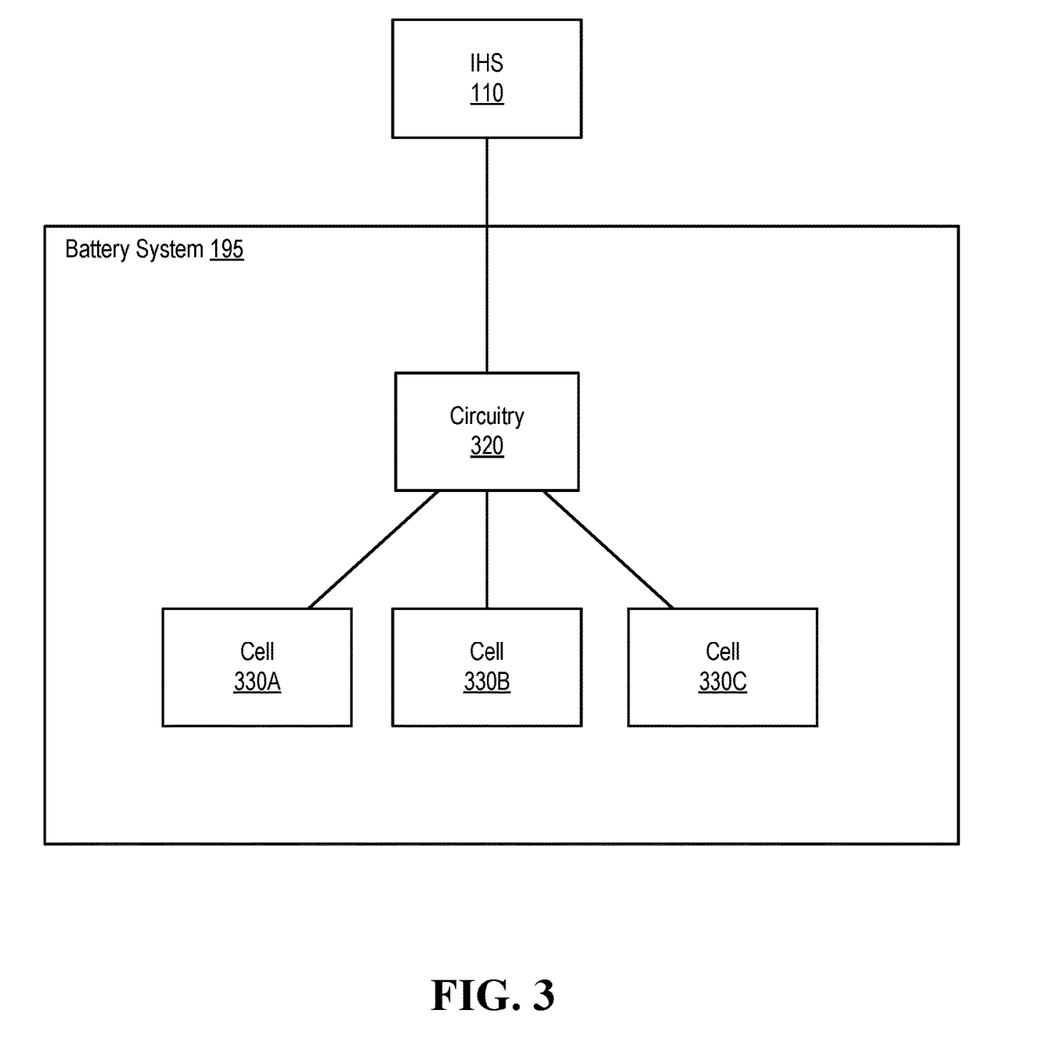
FIG. 3 illustrates a battery system, according to one or more embodiments.

Turning now to FIG. 3, a battery system is illustrated, according to one or more embodiments. As shown, battery system 195 may include circuitry 320 and cells 330A-330C (e.g., electrochemical cells, voltaic cells, etc.). As illustrated, battery system 195 may be coupled to IHS 110. In one example, battery system 195 may provide power to IHS 110. In a second example, battery system 195 may receive power from IHS 110. In another example, battery system 195 may communicate with IHS 110.

In one or more embodiments, circuitry 320 may regulate and/or monitor charging and/or discharging of battery system 195. In one example, circuitry 320 may regulate charging and/or discharging of one or more of cells 330A-330C. In a second example, circuitry 320 may monitor charging and/or discharging. In another example, circuitry 320 may include a processor that may store information associated with charging and/or discharging of battery system 195 and/or may provide the information associated with charging and/or discharging of battery system 195. For instance, the information associated with charging and/or discharging of battery system 195 may be provided, by circuitry 320, via bus 192.

Turning now to FIGS. 4A-4F, a graphical user interface that conveys information is illustrated, according to one or more embodiments. As shown in FIGS. 4A-4F, a graphical user interface (GUI) 410 may include a label 420, a qualitative information display area 430, a graphical indicator 440, and an information conveyance area 450. In one or more embodiments, qualitative information may be based on one or more numerical values, computations, and/or calculations. For example, the one or more numerical values, computations, and/or calculations may include utilizing one or more of a design capacity (DC) of battery system 195, a prediction of charge capacity (e.g., FCC) of battery system 195, and an expected margin of error of battery system 195, among others. For instance, an implementer may utilize different numerical values, computations, and/or calculations to correspond to and/or be associated with the qualitative information. In one or more embodiments, GUI 410 may be a GUI of or associated with APP 164. For example, GUI 410 may display information to a user associated with IHS 110. In one instance, GUI 410 may be displayed via a display of IHS 110. In another instance, GUI 410 may be displayed via a display coupled to IHS 110.

Figure 4A:
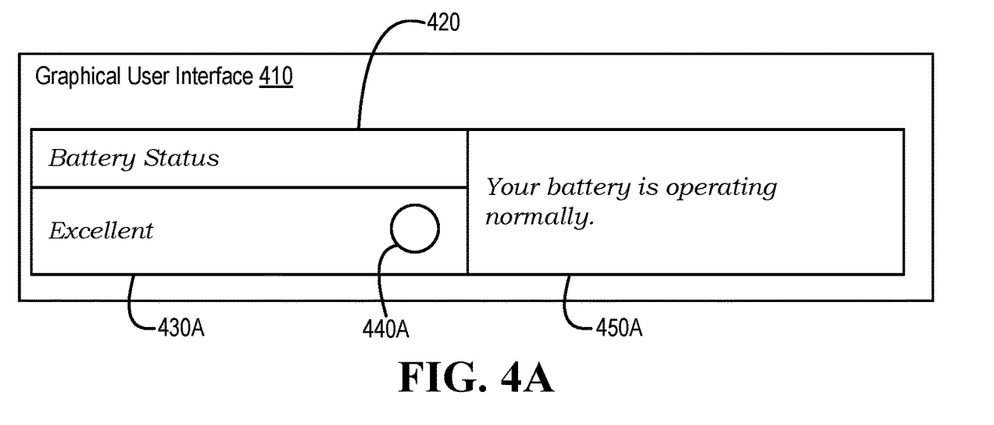
FIGS. 4A-4F illustrate a graphical user interface that conveys information, according to one or more embodiments.

In one or more embodiments, label 420 may indicate that information displayed via GUI 410 and/or via GUI elements 430-450 are associated with a battery status of battery system 195 of IHS 110. With reference to FIG. 4A, as illustrated, qualitative information display area 430A may indicate that a status of battery system 195 is "Excellent". In one or more embodiments, graphical indicator 440 may provide a color that is associated with a status of battery system 195. For example, graphical indicator 440A may provide a bright green color. As shown, information conveyance area 450A may display "Your battery is operating normally."

Figure 4B:
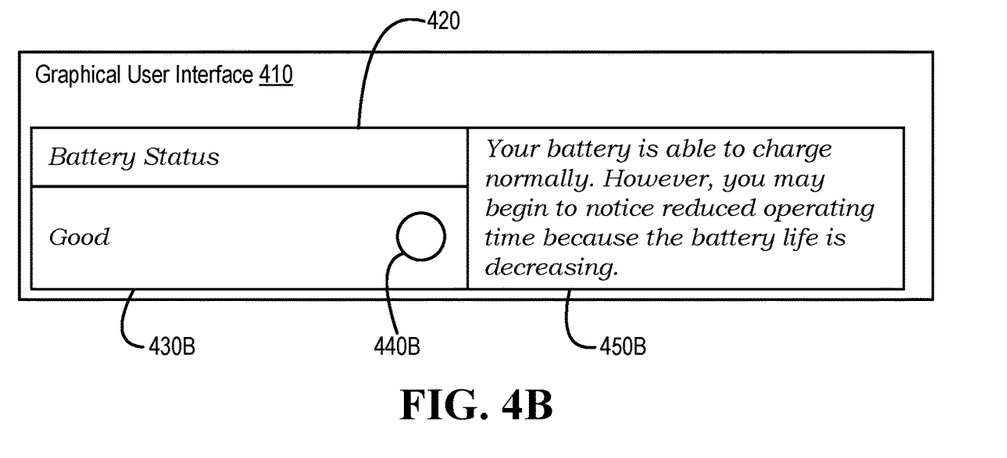
Figure 4C:
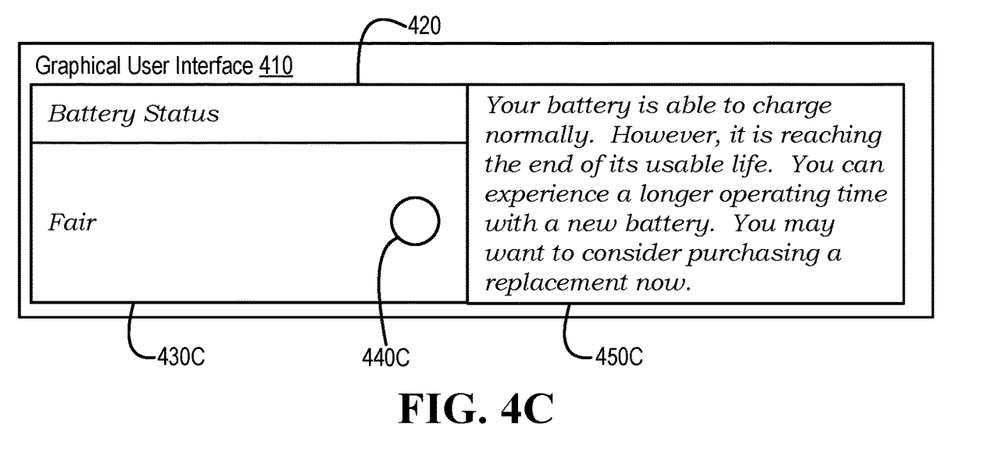

With reference to FIG. 4B, qualitative information display area 430B may indicate that a status of battery system 195 is "Good". For example, graphical indicator 440B may provide a dull green color. As shown, information conveyance area 450B may display "Your battery is able to charge normally. However, you begin to notice reduced operating time because the battery life is decreasing." With reference to FIG. 4C, qualitative information display area 430C may indicate that a status of battery system 195 is "Fair". For example, graphical indicator 440B may provide a yellow color. As shown, information conveyance area 450C may display "Your battery is able to charge normally. However, it is reaching the end of its usable life. You can experience a longer operating time with a new battery. You may want to consider purchasing a replacement now."

Figure 4D:
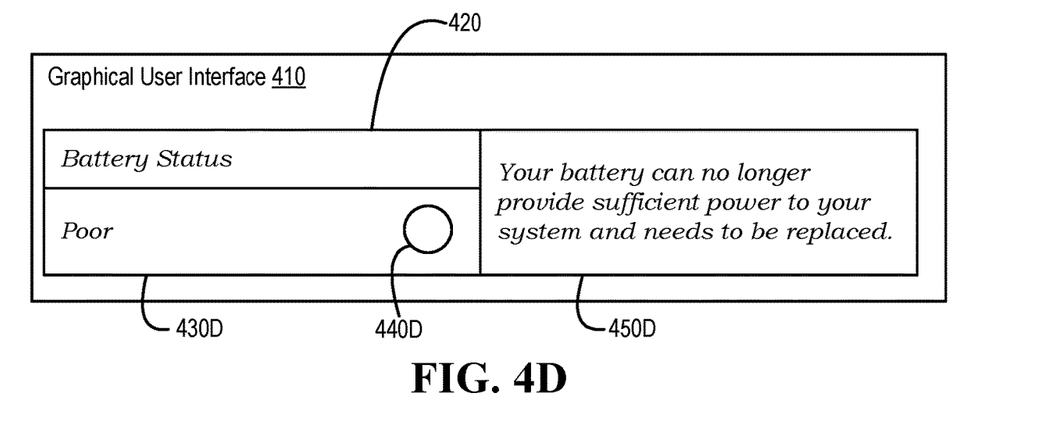
Figure 4E:
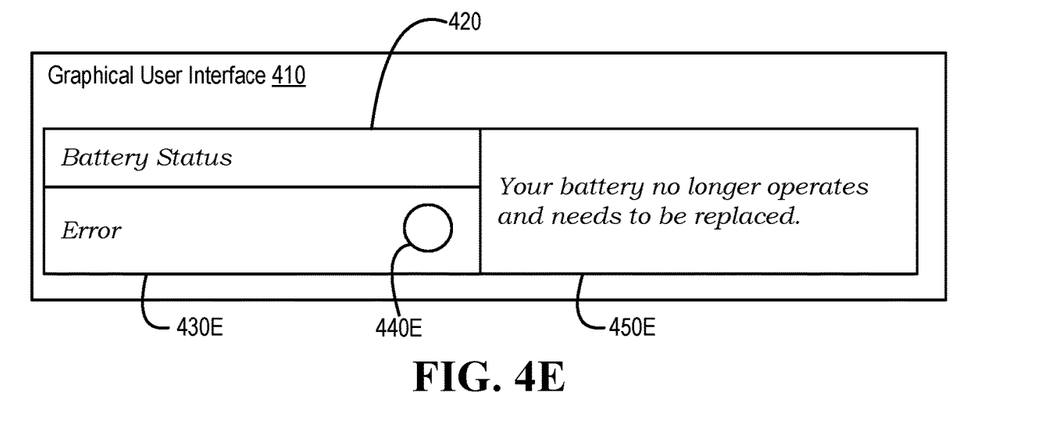

With reference to FIG. 4D, qualitative information display area 430D may indicate that a status of battery system 195 is "Poor". For example, graphical indicator 440D may provide a red color. As shown, information conveyance area 450D may display "Your battery can no longer provide sufficient power to your system and needs to be replaced." With reference to FIG. 4E, qualitative information display area 430E may indicate that a status of battery system 195 as no longer operating and may indicate "Error" as a status. For example, graphical indicator 440E may provide a red color. As shown, information conveyance area 450E may display "Your battery can no longer operates and needs to be replaced." With reference to FIG. 4F, qualitative information display area 430F may indicate that a status of battery system 195 as "Unknown". For example, graphical indicator 440F may provide a grey color. As shown, information conveyance area 450F may display "Your battery condition information cannot be determined."

In one or more embodiments, GUI 410 may receive a request from a user for information based on a condition metric of battery system 195. For example, APP 154 may receive the request from the user for information based on the condition metric of battery system 195 via GUI 410.

Figure 5:
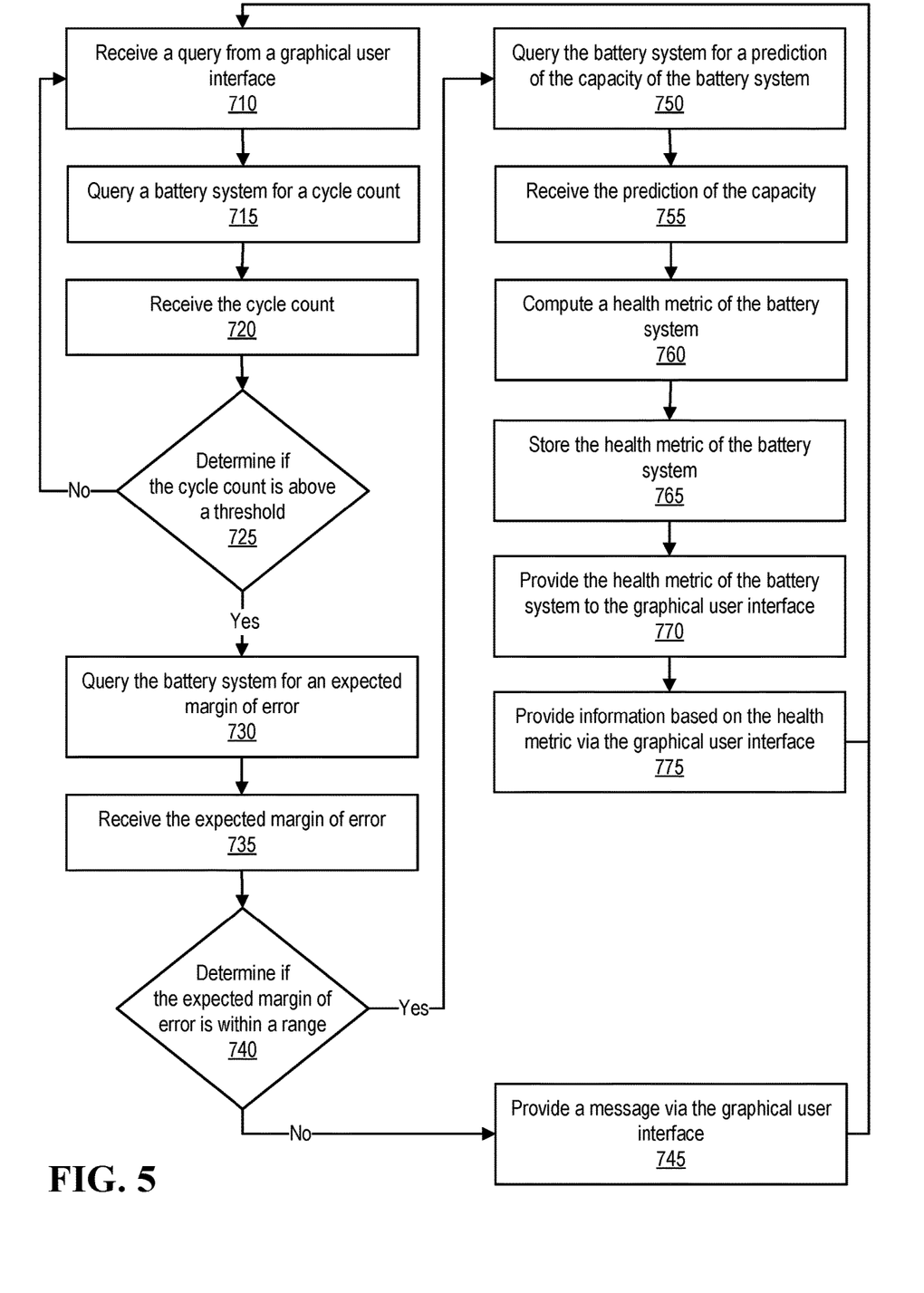
FIG. 5 illustrates a method of utilizing a battery system condition metric, according to one or more embodiments.

Turning now to FIG. 5, a method of utilizing a battery system condition metric is illustrated, according to one or more embodiments. At 710, a query from a graphical user interface may be received. For example, EC 190 may receive a query for a condition metric of battery system 195 from GUI 410. For instance, GUI 410 may be a GUI of or associated with APP 164, and receiving the query for the condition metric of battery system 195 from GUI 410 may include receiving the query for the condition metric of battery system 195 from APP 164. In one or more embodiments, APP 164 may utilize one or more of OS 162 and MIE 163 in querying EC 190 for the condition metric of battery system 195. In one example, MIE 163 may permit communications between OS 162 and EC 190. In a second example, MIE 163 may permit communications between EC 190 and APP 164 and/or GUI 410. In another example, MIE 163 may permit communications, via OS 162, between EC 190 and APP 164 and/or GUI 410. In one or more embodiments, MIE 163 may include one or more of a WMI and a CIM, among others.

At 715, a battery system may be queried for a cycle count. For example, EC 190 may query battery system 195 for a cycle count. In one instance, EC 190 may query battery system 195 for the cycle count via bus 192. In another instance, the cycle count may be a charge/discharge cycle count. At 720, the cycle count may be received. For example, EC 190 may receive the cycle count. For instance, the cycle count may be received via bus 192.

At 725, it may be determined if the cycle count is above a threshold. For example, EC 190 may determine if the cycle count is above the threshold. For instance, the threshold may be five. In one or more embodiments, the threshold may be a minimum number of cycles that would imply that an expected margin of error and/or a prediction of a power capacity of a battery system is reliable, credible, and/or suitable. For example, if a number of cycles is at or below the threshold, an expected margin of error and/or a prediction of a power capacity of battery system 195 may not be reliable. If the expected margin of error and/or the prediction of the power capacity of battery system 195 is/are at or below the threshold, a computation and/or calculation of a condition metric of battery system 195 may not be reliable, credible, and/or suitable. If the cycle count is not above the threshold, the method may proceed to 710, according to one or more embodiments.

If the cycle count is above the threshold, the battery system may be queried for an expected margin of error, at 730. For example, EC 190 may query battery system 195 for an expected margin of error, via bus 192. For instance, a query of query battery system 195 for the expected margin of error may include a query for a "MaxError" attribute. In one or more embodiments, the expected margin of error (e.g., "MaxError") may be or represent as a percentage. For example, circuitry 320 may increment the expected margin of error by 0.05 percent for every increment of the cycle count. For instance, circuitry 320 may increment the expected margin of error by 0.05 percent for every increment of the cycle count after a last chemical capacity (e.g., a "QMax" attribute) update.

Figure 4F:
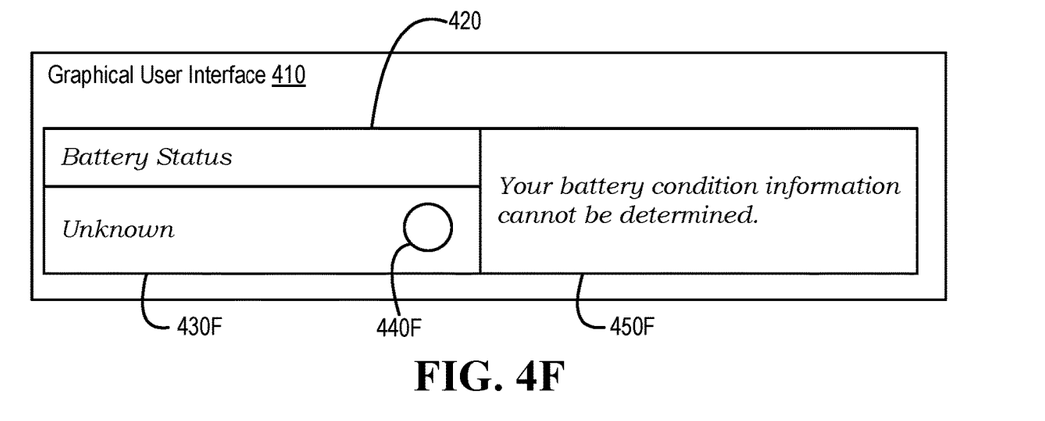

At 735, the expected margin of error may be received. For example, EC 190 may receive the expected margin of error via bus 192. At 740, it may be determined if the expected margin of error is within a range. For example, EC 190 may determine if the expected margin of error is within a range. If the expected margin of error is not within the range, a message may be provided via the GUI, at 745. For example, GUI 410 may provide the message. For instance, the message may include "Your battery condition information cannot be determined" as illustrated in FIG. 4F. In one or more embodiments, the range may include values from eight percent (8%) to two percent (2%), or the range may include values from eight percent (8%) to zero percent (0%). In one or more embodiments, the method may proceed to 710.

In one or more embodiments, providing the message may be provided via the GUI may include EC 190 providing GUI 410 and/or APP 164 the expected margin of error and/or information that indicates that a battery system condition metric may not be determined and/or the battery system condition metric may not be reliable, credible, and/or suitable. For example, EC 190 may utilize one or more of OS 162 and MIE 163 in providing the message to GUI 410 and/or APP 164. In one or more embodiments, a margin of error of FCC may be too great if the expected margin of error is outside the range. In one example, a computation and/or calculation of a battery system condition metric may not be reliable, credible, and/or suitable if the margin of error of FCC indicates that FCC is not reliable, credible, and/or suitable. In another example, the margin of error of may indicate that FCC is not reliable. In one or more embodiments, the range may include a threshold. For example, the range may include values at or below the threshold. For instance, the range may include values from the threshold to zero. For instance, determining if the expected margin of error is within the range may include determining if the expected margin of error is below a threshold.

If the expected margin of error is within the range, a prediction of capacity of the battery system may be queried, at 750. For example, EC 190 may query battery system 195 for a prediction of capacity (e.g., attribute FCC), via bus 192. At 755, the prediction of capacity may be received. For example, EC 190 may receive the prediction of capacity from battery system 195, via bus 192. At 760, a condition metric of the battery system may be computed. For example, EC 190 may compute a condition metric of battery system 195. For instance, computing the condition metric of battery system 195 may include calculating the condition metric of battery system 195. In one or more embodiments, computing the condition metric of the battery system may include computing a quotient of the prediction of capacity divided by a design capacity of the battery system. For example, the condition metric of the battery system may be equal to FCC divided by DC. For instance, a value of DC may be determined and/or set by a manufacturer of battery system 195.

At 765, the condition metric of the battery system may be stored. For example, EC 190 may store the condition metric of battery system 195. For instance, EC 190 may store the condition metric of battery system 195 via non-volatile memory medium 270 and/or EC data 276, among others. At 770, the condition metric of the battery system may be provided to the GUI. For example, EC 190 may provide the condition metric of battery system 195 to GUI 410 and/or APP 164. At 775, information based on the condition metric of the battery system may be provided via the GUI. For example, information based on the condition metric of battery system 195 may be provided via GUI 410. For instance, the information based on the condition metric of battery system 195 may be provided via GUI 410 as illustrated in FIGS. 4A-4E.

In one or more embodiments, qualitative information may be based on the condition metric of battery system 195 computed and/or calculated for battery system 195. For example, the condition metric of battery system 195 computed and/or calculated for battery system 195 may be displayed as qualitative information via GUI 410 as illustrated in FIGS. 4A-4E. For instance, an implementer may utilize different numerical values of the condition metric of battery system 195 computed and/or calculated for battery system 195 to correspond to and/or be associated with the qualitative information. In one or more embodiments, the method may proceed to 710.

In one or more embodiments, one or more of the method and/or process elements and/or one or more portions of a method and/or processor elements may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with one or more flowcharts, systems, methods, and/or processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
 an embedded controller, communicatively coupled to a battery system that is configured to power the information handling system;
 wherein the embedded controller is configured to:
  receive a cycle count from the battery system;
  determine that the cycle count is above a threshold;
  in response to determining that the cycle count is above the threshold, query the battery system for an expected margin of error;
  receive the expected margin of error from the battery system;
  determine that the expected margin of error is within a range; and
  in response to determining that the expected margin of error is within the range:
   compute a condition metric of the battery system based on a prediction of a capacity of the battery system and a design capacity of the battery system; and
   store the condition metric of the battery system.

2. The information handling system of claim 1, wherein the embedded controller is further configured to, in response to determining that the expected margin of error is within the range, query the battery system for the prediction of the capacity of the battery system.

3. The information handling system of claim 1, wherein, to determine that the expected margin of error is within the range, the embedded controller is further configured to determine that the expected margin of error is below another threshold.

4. The information handling system of claim 1, further comprising:
a processor; and
a memory medium communicatively coupled to the processor;
wherein the embedded controller is communicatively coupled to the processor; and
wherein the memory medium stores instructions executable by the processor to:
receive, via a graphical user interface, a request for the condition metric of the battery system; and
provide, via the graphical user interface, information indicating the condition metric of the battery system.

5. The information handling system of claim 1, further comprising:
a processor; and
a memory medium communicatively coupled to the processor;
wherein the embedded controller is communicatively coupled to the processor; and
wherein the memory medium stores instructions executable by the processor to:
query the embedded controller for the condition metric of the battery system.

6. The information handling system of claim 5,
wherein the memory medium further stores instructions further executable by the processor to utilize a management information exchange that permits communications between an operating system and the embedded controller, when the processor executes the instructions to query the embedded controller for the condition metric of the battery system; and
wherein the management information exchange includes at least one of a Windows Management Interface (WMI) and a Common Information Model (CIM).

7. The information handling system of claim 1, wherein the information handling system is a portable information handling system configured to be carried by a user.

8. The information handling system of claim 1, further comprising:
the battery system.

9. A method, comprising:
receiving, by an embedded controller, a cycle count from a battery system;
determining, by the embedded controller, that the cycle count is above a threshold;
in response to the determining, by the embedded controller, that the cycle count is above the threshold, querying, by the embedded controller, the battery system for an expected margin of error;
receiving, by the embedded controller, the expected margin of error from the battery system;
determining, by the embedded controller, that the expected margin of error is within a range; and
in response to the determining, by the embedded controller, that the expected margin of error is within the range:
computing, by the embedded controller, a condition metric of the battery system based on a prediction of a capacity of the battery system and a design capacity of the battery system; and
storing, by the embedded controller, the condition metric of the battery system.

10. The method of claim 9, further comprising:
in response to the determining, by the embedded controller, that the expected margin of error is within the range, querying, by the embedded controller, the battery system for the prediction of the capacity of the battery system.

11. The method of claim 9, wherein the determining, by the embedded controller, that the expected margin of error is within the range includes determining, by the embedded controller, that the expected margin of error is below another threshold.

12. The method of claim 9, further comprising:
receiving, via a graphical user interface, a request for the condition metric of the battery system; and
providing, via the graphical user interface, information indicating the condition metric of the battery system.

13. The method of claim 12, further comprising:
querying the embedded controller for the condition metric of the battery system.

14. The method of claim 13,
wherein the querying the embedded controller for the condition metric of the battery system includes utilizing a management information exchange that permits communications between an operating system and the embedded controller; and
wherein the management information exchange includes at least one of a Windows Management Interface (WMI) and a Common Information Model (CIM).

15. The method of claim 9,
wherein the battery system is configured to provide power to an information handling system; and
wherein the information handling system is a portable information handling system configured to be carried by a user.

16. An embedded controller, configured to:
receive a cycle count from a battery system;
determine that the cycle count is above a threshold;
in response to determining that the cycle count is above the threshold, query the battery system for an expected margin of error;
receive the expected margin of error from the battery system;
determine that the expected margin of error is within a range; and
in response to determining that the expected margin of error is within the range:
compute a condition metric of the battery system based on a prediction of a power capacity of the battery system and a design capacity of the battery system; and
store the condition metric of the battery system.

17. The embedded controller of claim 16, wherein the embedded controller is further configured to, in response to determining that the expected margin of error is within the range, query the battery system for the prediction of the power capacity of the battery system.

18. The embedded controller of claim 16, wherein, to determine that the expected margin of error is within the range, the embedded controller is further configured to determine that the expected margin of error is below another threshold.

* * * * *